US009777402B2

(12) United States Patent
Tassev et al.

(10) Patent No.: US 9,777,402 B2
(45) Date of Patent: Oct. 3, 2017

(54) HETEROEPITAXIAL GROWTH OF ORIENTATION-PATTERNED MATERIALS ON ORIENTATION-PATTERNED FOREIGN SUBSTRATES

(71) Applicant: The United States of America, as represented by the Secretary of the Air Force, Washington, DC (US)

(72) Inventors: Vladimir L. Tassev, Beavercreek, OH (US); Rita D. Peterson, Bellbrook, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 28 days.

(21) Appl. No.: 15/455,370

(22) Filed: Mar. 10, 2017

(65) Prior Publication Data
US 2017/0183793 A1 Jun. 29, 2017

Related U.S. Application Data

(62) Division of application No. 14/934,636, filed on Nov. 6, 2015, now Pat. No. 9,647,156.
(Continued)

(51) Int. Cl.
*H01L 31/0352* (2006.01)
*C30B 25/04* (2006.01)
(Continued)

(52) U.S. Cl.
CPC ............. *C30B 25/04* (2013.01); *C30B 25/18* (2013.01); *C30B 29/42* (2013.01); *C30B 29/44* (2013.01);
(Continued)

(58) Field of Classification Search
CPC ..... B82Y 20/00; G02F 1/3558; G02F 1/3556; G02F 1/3775; G02F 2001/3548
(Continued)

(56) References Cited

U.S. PATENT DOCUMENTS 6,273,949 B1 * 8/2001 Eyres ..................... B82Y 20/00
117/101
7,099,073 B2 * 8/2006 Chowdhury ........... B82Y 20/00
359/328

(Continued)

OTHER PUBLICATIONS

Pomeranz et al.; "1-μm-pumped OPO based on orientation-patterned GaP," Proc. of SPIE vol. 9347; Apr. 17, 2015.
(Continued)

*Primary Examiner* — Jonathan Han
(74) *Attorney, Agent, or Firm* — AFMCLO/JAZ; Timothy Barlow

(57) ABSTRACT

A method of forming a layered OP material is provided, where the layered OP material comprises an OPGaAs template, and a layer of GaP on the OPGaAs template. The OPGaAs template comprises a patterned layer of GaAs having alternating features of inverted crystallographic polarity of GaAs. The patterned layer of GaAs comprises a first feature comprising a first crystallographic polarity form of GaAs having a first dimension, and a second feature comprising a second crystallographic polarity form of GaAs having a second dimension. The layer of GaP on the patterned layer of GaAs comprises alternating regions of inverted crystallographic polarity that generally correspond to their underlying first and second features of the patterned layer of GaAs. Additionally, each of the alternating regions of inverted crystallographic polarity of GaP are present at about 100 micron thickness or more.

10 Claims, 10 Drawing Sheets

Related U.S. Application Data

(60) Provisional application No. 62/076,520, filed on Nov. 7, 2014, provisional application No. 62/183,208, filed on Jun. 23, 2015.

(51) Int. Cl.
  *G02F 1/355* (2006.01)
  *C30B 25/18* (2006.01)
  *C30B 29/44* (2006.01)
  *C30B 29/42* (2006.01)
  *G02F 1/39* (2006.01)

(52) U.S. Cl.
  CPC .......... *G02F 1/3556* (2013.01); *G02F 1/3558* (2013.01); *G02F 1/39* (2013.01); *G02F 2001/392* (2013.01)

(58) Field of Classification Search
  USPC ............ 117/95, 101; 359/326; 385/122, 129
  See application file for complete search history.

(56) References Cited

U.S. PATENT DOCUMENTS

| | | | |
|---|---|---|---|
| 7,339,718 | B1 | 3/2008 | Vodopyanov et al. |
| 8,154,792 | B1 | 4/2012 | Weyburne et al. |
| 8,619,356 | B1 | 12/2013 | Weyburne et al. |
| 8,896,912 | B2 | 11/2014 | Shah et al. |
| 8,995,494 | B1 | 3/2015 | Pomeranz et al. |
| 9,118,163 | B2 | 8/2015 | Kim et al. |
| 2013/0156062 | A1* | 6/2013 | Kondo ............... G02F 1/35 372/72 |
| 2014/0037258 | A1* | 2/2014 | Botez .................. C30B 29/403 385/129 |

OTHER PUBLICATIONS

"Tachibana et al. ""Quasi-phase-matched parametric fluorescence inperiodically inverted GaAs waveguides,"" Conferences on Lasers and Electro-Optics, Jun. 2003, Baltimore, MD."

Szilagyi et al., "A quasi-phase-matching technique for efficient optical mixing and frequency doubling," Journal of Applied Physics, vol. 47, No. 5, May 1976.

Schunemann et al., "All-epitaxial growth of orientation-patterned gallium phosphide (OPGaP)," LSRPDTD, OSA 2012.

Tassev et al., "Epitaxial growth of quasi-phasematched GaP for nonlinear applications: Systematic process improvements," Journal of Crystal Growth, 352, 2012, pp. 72-77, (online Jan. 8, 2012).

Tomita, Isao, "Fabrication and characterization of a quasi-phase-matched GaP optical device for terahertz-wave generation," Optical Materials, 32 (2009), 323-328 (online Sep. 25, 2009).

Schunemann, et al. "Future directions in quasi-phasematched semiconductors for mid-infrared lasers," Proc. of SPIE vol. 7917 79171F-1; (Feb. 11, 2011).

Tassev et al., "Growth and study of nonlinear optical materials for frequency conversion devices with applications in defence and security," Proc. of SPIE vol. 9253 925318-1, (Oct. 31, 2014).

Kurimura, Sunao, "Materials and Devices for Quasi-Phase-Matched Nonlinear Optics," NLO.2009.NThB4 Conference: Nonlinear Optics: Materials, Fundamentals and Applications (Jul. 12-17, 2009).

Vodopyanov, et al., "Optical parametric oscillation in quasi-phase-matched GaAs," Optics Letters, vol. 29, No. 16, pp. 1912-1915, (Aug. 15, 2004).

Schunemann, et al., "Optical parametric oscillation in quasi-phase-matched GaP," Proc. of SPIE vol. 9347 93470J-1, (Mar. 24, 2015).

Termkoa, et al., "Production of orientation-patterned GaP templates using wafer fusion techniques," Optical Materials, 34 (2011), pp. 30-35, (online Aug. 27, 2011).

Tassev, et al., "Progress in orientation-patterned GaP for next-generation nonlinear optical devices," Proc. of SPIE vol. 8604 86040V-1, (Mar. 12, 2013).

Lallier, et al., "QPM-GaAs for Mid-Infrared Applications," MICS 2009, Trouville, France.

Matsushita, et al., "Quasi-Phase-Matched Parametric Fluorescence in a Periodically Inverted GaP Waveguide," Applied Physics Express 2 (2009) (online May 22, 2009).

Schunemann, et al., "Recent advances in all-epitaxial growth and properties of orientation-patterned gallium arsenide (OP-GaAs)," Optical Society of America, 2009 (May 2009).

Gil-Lafon, et al., "Selective growth of GaAs by HVPE: keys for accurate control of the growth morphologies," Journal of Crystal Growth, 222 (2001) pp. 482-496.

\* cited by examiner

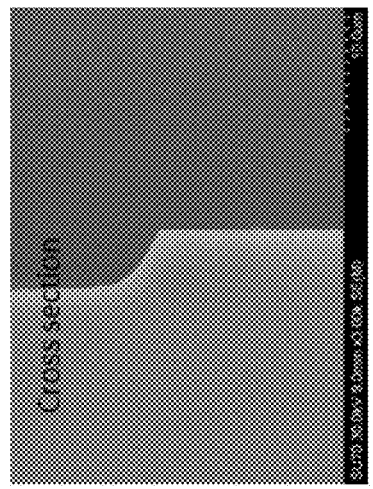
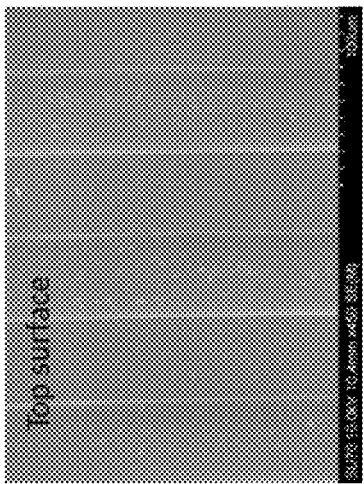
FIG. 9A-9B
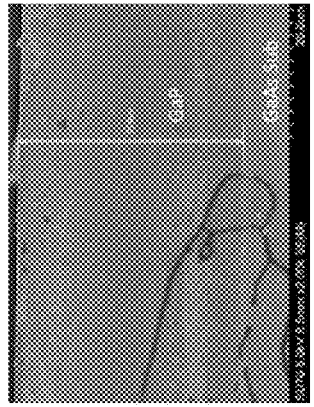
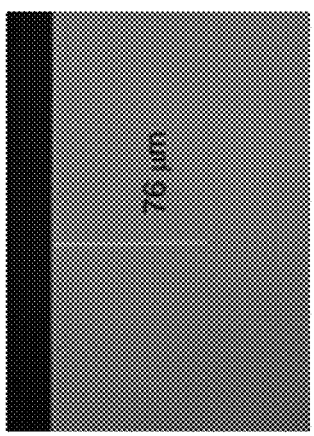
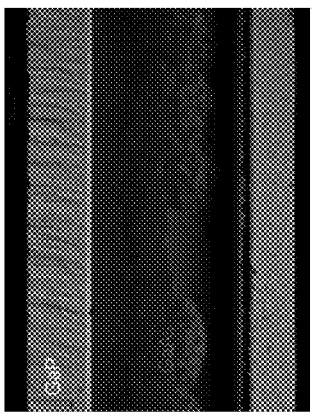
FIG. 10A-10C

HETEROEPITAXIAL GROWTH OF ORIENTATION-PATTERNED MATERIALS ON ORIENTATION-PATTERNED FOREIGN SUBSTRATES

RELATED APPLICATION

The present application is a Divisional patent application of U.S. patent application Ser. No. 14/934,636 filed on Nov. 6, 2015, and issued as U.S. Pat. No. 9,647,156 on May 9, 2017, which rightfully claimed priority to U.S. Provisional Patent Application Ser. Nos. 62/076,520 filed Nov. 7, 2014, and 62/183,208 filed on Jun. 23, 2015, the disclosures of which are hereby incorporated herein by reference in their entirety.

RIGHTS OF THE GOVERNMENT

The invention described herein may be manufactured and used by or for the Government of the United States for all governmental purposes without the payment of any royalty.

FIELD OF THE INVENTION

The present invention is directed to orientation-patterned (OP) nonlinear optical (NLO) materials, and more particularly toward OP gallium phosphide (OPGaP) grown on OP gallium arsenide (OPGaAs) templates and methods of making same.

BACKGROUND

Reliable, efficient, wavelength-agile, high-brightness, room temperature laser sources operating in the mid-infrared (IR) and terahertz (THz) region are in great demand for a wide variety of applications in defense (IR countermeasures, laser radar, IR communications); security (scanners, remote sensing of chemical and biological agents); industry (gas sensing, leak detection, pollution monitoring, process control); science (THz spectroscopy); and medicine (IR and THz medical images). Over the years the search for a solution has considered a number of different approaches, starting with the investigation of a great variety of binary and ternary semiconductor materials.

One of the most promising approaches is to convert the frequency of available mature pump lasers into the waveband of interest via a nonlinear material. Initially employing bulk birefringent phase-matching (BPM) crystals, the idea was eventually extended to exploit quasi-phase matched (QPM) materials. The first such practical structure was realized in periodically-poled lithium niobate ($LiNbO_3$) (PPLN), but strong intrinsic absorption has limited the usage of this and similar ferroelectric crystals to wavelengths shorter than about 4 μm, i.e. they are partly usable for only the first of two atmospheric transparency windows (2 μm to 5 μm, but not 8 μm to 12 μm).

In non-ferroelectric materials, quasi-phase matching can be achieved by spatially inverting the nonlinear susceptibility. Initially this was done through alternating the orientation of thin wafers ordered in a stack. However, the high optical losses due to the multiple wafer interfaces, the small thickness required, as well as the tight fabrication tolerances made this approach inefficient for practical devices. Quasi-phase matching is now more favorably realized in semiconductors by growing thick layers of material on thin templates, which have been designed in advance with the desired pattern. For example, OP-gallium arsenide (OP-GaAs) fabricated using this approach has emerged as a promising nonlinear material, due to its broad IR transparency, high nonlinear optical susceptibility, and ability to be grown on OP-templates following the engineered periodic structure.

However, significant two-photon absorption (2PA) in the wavelength range of about 1 μm to about 1.7 μm has limited QPM GaAs from taking advantage of many convenient pump laser sources such as Nd-, Yb- and Cr-doped yttrium aluminum garnet (YAG) lasers radiating in this region, or laser diodes and Er-doped fiber lasers radiating around the important telecommunications wavelength 1.55 μm. There have been isolated attempts in industry to work around these pump source issues rather than solve them. For example, one of them uses a 1-μm-pumped optical parametric oscillator (OPO) to provide output from 1.7 μm to 2 μm, which is beyond of the high end of the GaAs 2PA range. This output wavelength can then be used as a pump for the GaAs QPM structure. The inclusion of a second nonlinear conversion stage, however, increases the complexity of the overall system as well as the cost of the final product. Accordingly, the high 2PA of GaAs at 1 μm to 1.7 μm is a serious limitation that has naturally led to interests in other materials, and particularly gallium phosphide (GaP) as a potential QPM material.

In contrast with GaAs, GaP has a negligible two-photon absorption (2PA) in the 1 μm to 1.7 μm wavelength range, and a comparable nonlinear susceptibility. In addition, GaP has twice the thermal conductivity (at much lower thermal expansion coefficients) and also broad transparency, which, in contrast with GaAs, conveniently starts in the visible portion of the spectrum facilitating alignment in an optical setup. Due to these factors, interest in QPM GaP has increased rapidly, and frequency conversion devices (FCDs) based on stacks of GaP wafers have already been designed. The epitaxial growth of periodic GaP structures by Molecular Beam Epitaxy (MBE) and metalorganic chemical vapor deposition (MOCVD) has also been initiated. Hydride vapor phase epitaxy (HVPE), however, appears to be the only approach that is capable of producing apertures large enough for high power applications.

In order to produce high quality OP materials, high quality (e.g., minimal defects) OP templates are desired. Unfortunately, OPGaP templates having sufficiently high quality suitable for homoepitaxial growth are presently unavailable, partly due to the low quality (e.g., high etch pit density (EPD) and poor parallelism) of the commercially-available GaP wafers, and partly due to the not-yet-optimized template preparation techniques. Thus, the OPGaP material grown by HVPE on the available OPGaP templates is generally of low quality.

Accordingly, there is a need for high quality OPGaP materials and methods for making them.

SUMMARY

The present invention overcomes one or more of the foregoing problems and other shortcomings, drawbacks, and challenges of the prior art methods toward making OP gallium phosphide (OPGaP). While the invention will be described in connection with certain embodiments, it will be understood that the invention is not limited to these embodiments. To the contrary, this invention includes all alternatives, modifications, and equivalents as may be included within the spirit and scope of the present invention.

In accordance with an embodiment of the present invention, a layered orientation-patterned (OP) material is provided that comprises an orientation-patterned (OP) gallium arsenide (OPGaAs) template, and a layer of gallium phosphide (GaP) on the OPGaAs template. The OPGaAs template comprises a patterned layer of GaAs having alternating features of inverted crystallographic polarity of GaAs. The patterned layer of GaAs comprises a first feature comprising a first crystallographic polarity form of GaAs having a first dimension, and a second feature comprising a second crystallographic polarity form of gallium arsenide having a second dimension, wherein a sum of the first and second dimensions defines a period of the patterned layer of GaAs. The layer of GaP on the patterned layer of GaAs comprises alternating regions of inverted crystallographic polarity of GaP, wherein the alternating regions generally correspond to their underlying first and second features of the patterned layer of GaAs, and wherein each of the alternating regions of inverted crystallographic polarity of GaP are present at about 100 micron thickness or more.

In accordance with an embodiment of the present invention, a method for forming a layered OP material is provided that comprises (1) placing an OPGaAs template comprising a patterned layer of GaAs into a hydride vapor phase epitaxy (HVPE) reaction chamber comprising an elemental gallium sample, wherein the patterned layer of GaAs has alternating features of inverted crystallographic polarity of GaAs; (2) establishing an HVPE reaction chamber pressure of about 10 Torr or less; (3) flowing a gaseous mixture of a hydrogen halide and hydrogen across the elemental gallium sample to form gallium halide; (4) reacting gallium halide with an excess of phosphine to form GaP, wherein an atomic ratio of phosphorus to gallium is between about 6.0 to about 8.0; (5) growing a layer of GaP on the OPGaAs template at a temperature in a range of about 715° C. to about 740° C., wherein the layer of GaP comprises alternating regions of inverted crystallographic polarity of GaP that generally correspond to the first and second features of the patterned layer of GaAs; and (6) continuing to grow the layer of GaP to reach a thickness of about 100 micron thickness or more. The patterned layer of GaAs comprises a first feature comprising a first crystallographic polarity form of GaAs having a first dimension, and a second feature comprising a second crystallographic polarity form of GaAs having a second dimension, wherein a sum of the first and second dimensions defines a period of the patterned layer of GaAs.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawing, which are incorporated in and constitute a part of this specification, illustrate embodiments of the invention and, together with a general description of the invention given above, and the detailed description given below, serve to explain the invention. It will be appreciated that for purposes of clarity and where appropriate, reference deemed numerals have been repeated in the figures to indicate corresponding features.

FIGS. 9A and 9B show scanning electron microscope (SEM) images of an OPGaAs template from a top view showing alternate domains with some etch damage in the etched region (9A) and a cross-sectional image showing no discernible interface (9B);

FIGS. 10A and 10B show two optical images of cross-sections of OPGaP/GaAs hetero-structures at different magnifications;

FIG. 10C shows a SEM image of a cross-section of a OPGaP/GaAs hetero-structure obtained after 1 hour of growth.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, shapes, and colors of various illustrated components, will be determined in part by the particular intended application and use environment. Certain features of the illustrated embodiments have been enlarged or distorted relative to others to facilitate visualization and clear understanding.

DETAILED DESCRIPTION OF EMBODIMENTS OF THE INVENTION

Figure 1:
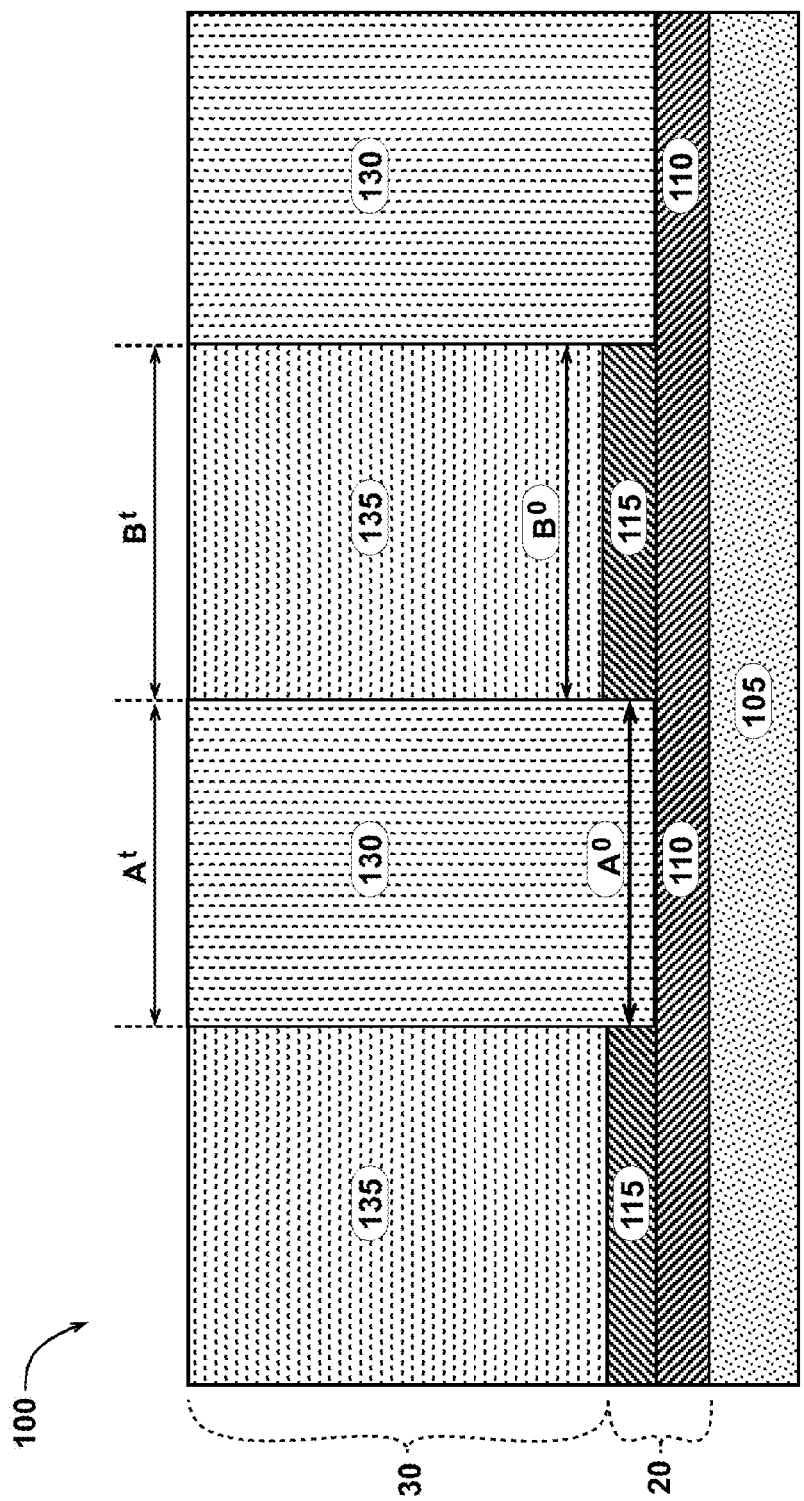
FIG. 1 is a schematic illustrating a layered OP-material showing an OPGaAs template and a hetero-epitaxially grown OPGaP layer, in accordance with an embodiment of the present invention.

In reference to FIG. 1, a schematic illustrating a layered orientation patterned (OP) material 100 is provided showing an OP-gallium arsenide (OPGaAs) template 20 and a hetero-epitaxially grown OP-gallium phosphide (OPGaP) layer 30, in accordance with an embodiment of the present invention. The OPGaAs template 20 and the OPGaP layer 30 are shown overlying a substrate layer 105. The OPGaAs template 20 comprises a patterned layer of GaAs having alternating features of inverted crystallographic polarity of GaAs. The patterned layer of GaAs comprises a first feature comprising a first crystallographic polarity form of GaAs 115 having a first dimension $A^0$, and a second feature comprising a second crystallographic polarity form 110 of gallium arsenide having a second dimension $B^o$, wherein a sum of the first and second dimensions ($A^o+B^o$) defines a period (or pitch) of the patterned layer of GaAs 20. The layer of GaP 30 on the patterned layer of GaAs 20 comprises alternating regions of inverted crystallographic polarity (130, 135) of GaP. The dimensions ($A^t$, $B^t$) of the alternating regions (130, 135) of GaP generally correspond to the dimensions ($A^o+B^o$) of the underlying first and second features of the patterned layer of GaAs 20.

In accordance with an embodiment of the present invention, the period of the patterned layer of GaAs 20 of the layered OP material 100 is at least 30 microns, with at least each of the first and second dimensions ($A^o+B^o$) having a minimum width of about 15 microns. For example, the period of the patterned layer of GaAs 20 may be about 40 microns, about 50 microns, about 60 microns, about 70 microns, about 80 microns, about 90 microns, about 100 microns, about 120 microns, about 140 microns, about 160 microns, about 170 microns, about 190 microns, or about 200 microns or more, or within a range between any of the foregoing. While the first and second dimensions ($A^o$, $B^o$) may be approximately equal in width, this is not required. For most applications, the layered OP material 100 includes a plurality of first and second features, where the periodicity of the alternating crystallographic polarity forms of GaAs is approximately constant across the OPGaAs template 20. However, the periodicity of the alternating crystallographic polarity forms of GaAs may vary (e.g., increasing or decreasing) across the OPGaAs template 20.

In accordance with embodiments of the present invention, the thickness of the OPGaP layer is at least about 100 microns or more. Additionally, each of the alternating regions (130, 135) of the inverted crystallographic polarity forms of GaP is present at about 100 micron thickness or more. For example, the thickness of the OPGaP layer 30 may be about 150 microns, about 200 microns, about 250 microns, or more. Moreover, the dimensions ($A^t$, $B^t$) of the alternating regions (130, 135) of the OPGaP layer 30 generally maintain fidelity with its respective underlying first and second features of the patterned layer of GaAs 20 within about 20% or less of the first and second dimensions ($A^o$, $B^o$). For example, in an embodiment, dimension $A^t$ is within about 20% of $A^o$, and dimension $B^t$ is within about 20% of $B^o$, at a thickness (t) of the OPGaP layer 30 equal to about 200 microns. In other words, $A^t$ should be within a range of about $A^o \pm 0.2A^o$, and $B^t$ should be within a range of about $B^o \pm 0.2B^o$. It is preferred that the dimensions ($A^t$, $B^t$) of the alternating regions (130, 135) of GaP are within about 15% or less, or about 10% or less, or about 5% or less of the first and second dimensions ($A^o$, $B^o$), respectively.

Figure 2:
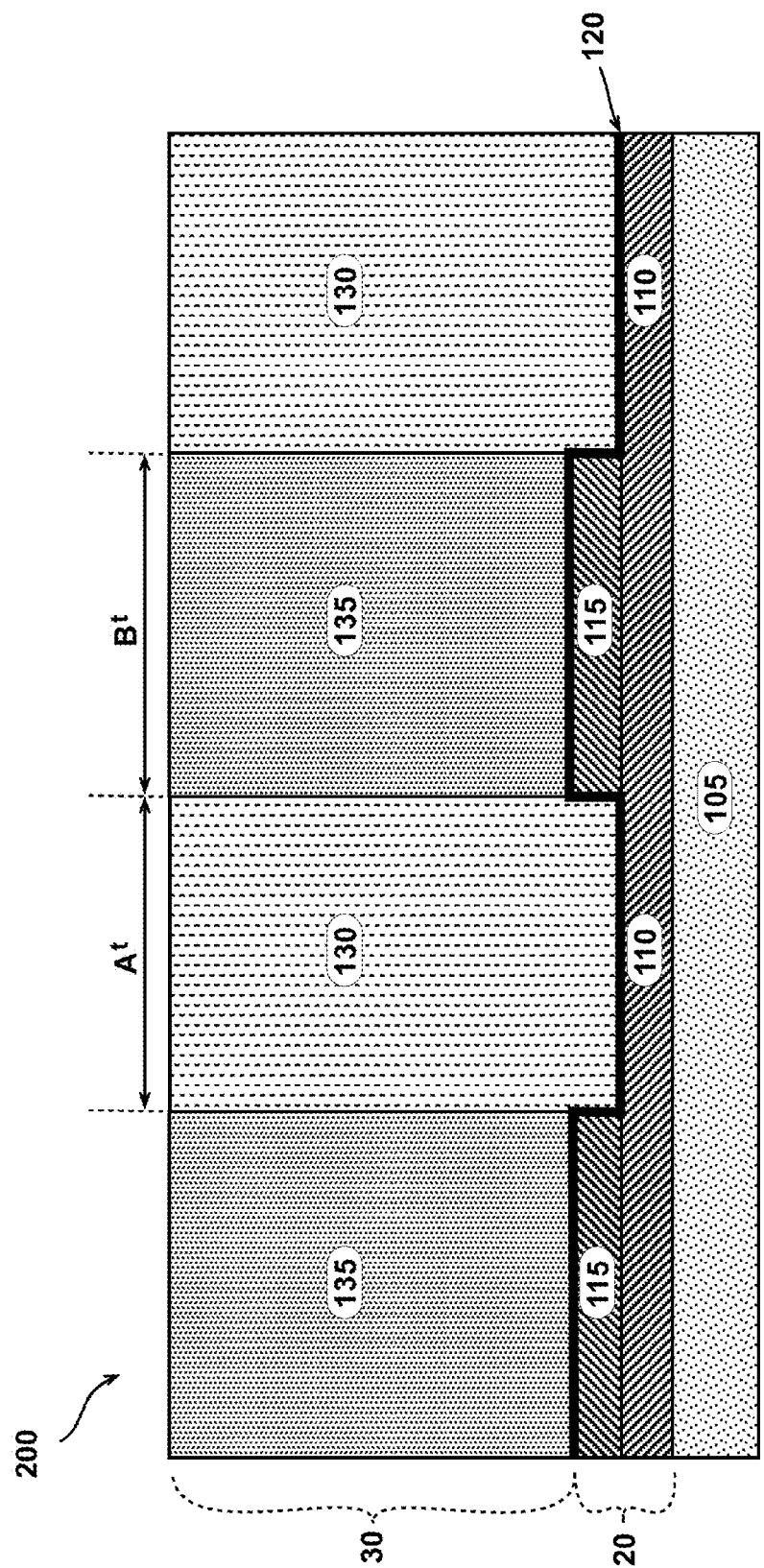
FIG. 2 is a schematic illustrating another layered OP-material showing an OPGaAs template, a hetero-epitaxially grown OPGaP layer, and a ternary $GaAs_xP_{1-x}$ layer there between, in accordance with another embodiment of the present invention.

In reference to FIG. 2, a schematic illustrating another layered OP material 200 is provided showing an OPGaAs template 20 and a hetero-epitaxially grown OPGaP layer 30, in accordance with another embodiment of the present invention. In comparison to FIG. 1, the difference with the embodiment shown in FIG. 2 is the presence of an intermediate layer 120 of a ternary mixture of gallium, arsine, and phosphorous between the OPGaAs template 20 and the OPGaP layer 30. The ternary mixture may be represented by a general chemical formula $GaAs_xP_{1-x}$, where x is in the range of $0<x<1$. For example, x may be about 0.1, about 0.15, about 0.2, about 0.25, about 0.30, about 0.35, about 0.4, about 0.45, about 0.50, about 0.55, about 0.60, about 0.65, about 0.70, about 0.75, about 0.80, about 0.85, about 0.90, or within a range between any two of the foregoing.

The intermediate layer 120 of the ternary mixture of gallium, arsenic, and phosphorous may be formed by utilizing both arsine and phosphine in the fabrication process, as further described below. When present, the thickness of the intermediate layer 120 may be dependent on the duration of exposure to arsine and phosphine. In an embodiment, the exposure to arsine and phosphine is conducted for a duration sufficient to form the ternary mixture layer of gallium, arsenic, and phosphorous at a thickness of about 10 nm or more, or about 100 nm or more. For example, the thickness of the intermediate layer 120 may be grown to about 1 micron to about 2 microns under certain conditions.

Hydride vapor phase epitaxy (HVPE) is an epitaxial growth technique often employed to produce semiconductors such as GaN, GaAs, GaP, InP and their related compounds, in which hydrogen chloride is reacted at elevated temperature with the group-III metal(s) to produce gaseous metal chlorides, which then can react with other reagents to yield the desired compound(s). Carrier gasses commonly used in HVPE include hydrogen ($H_2$) or inert gases, such as argon. In accordance with an embodiment of the present invention, HVPE is used to perform heteroepitaxial growth of OPGaP on an OPGaAs template 20.

Figure 3:
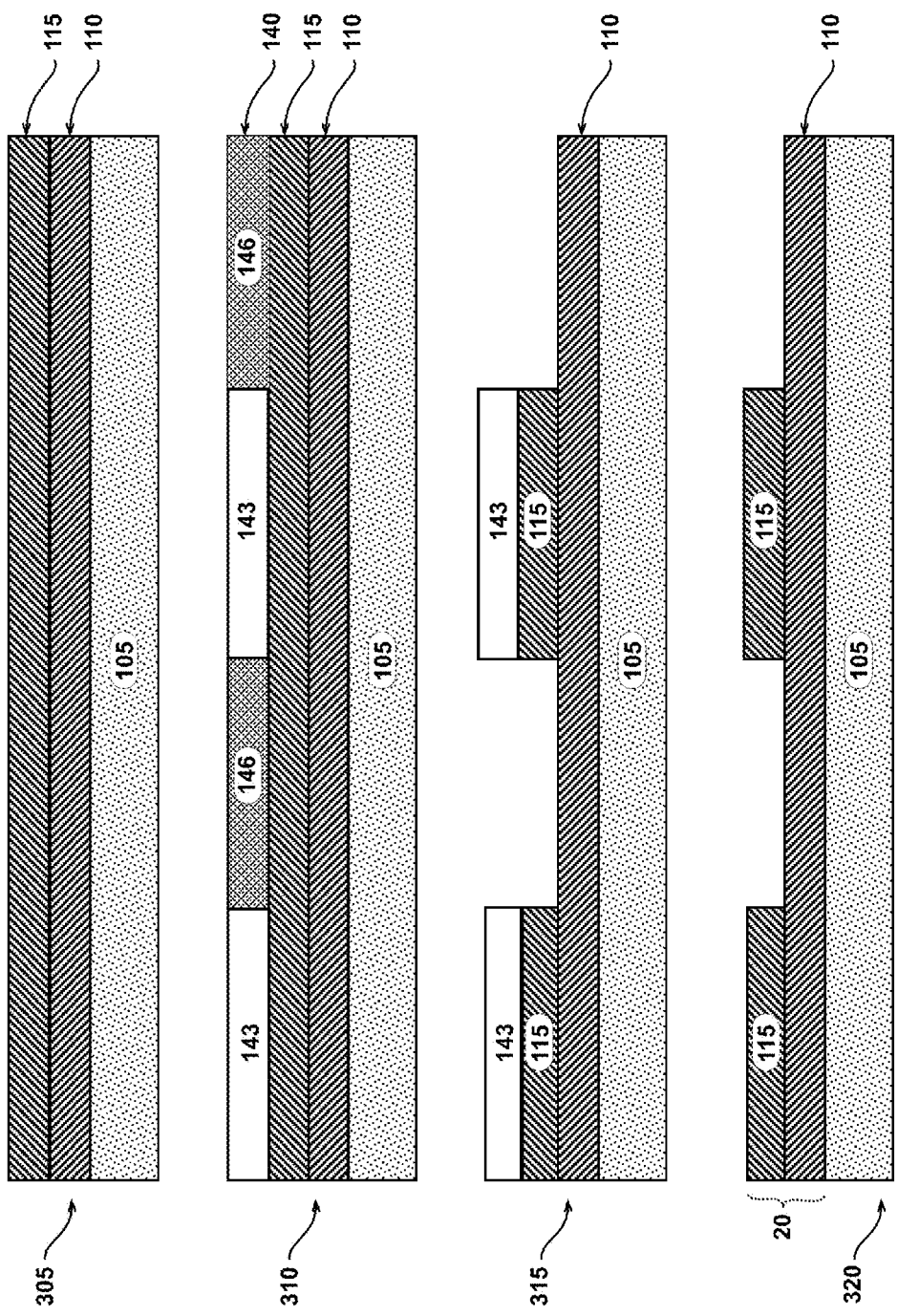
FIG. 3 is schematic illustrating an exemplary method for preparing an OPGaAs template, in accordance with another embodiment of the present invention.

With reference to FIG. 3, a schematic is provided that illustrates an exemplary method for preparing an OPGaAs template 20 suitable for carrying out the heteroepitaxial growth of OPGaP. In structure 305, two fused GaAs wafers 110, 115 are shown atop a substrate layer 105. On-axis (001) GaAs wafers, as well wafers with miscuts in the range 0°-10° toward several different orientations, including the orientations (011) and (111)B, may be used to fabricate the templates by wafer bonding or by an MBE assisted polarity alternating process, or by any other technique that results in OP-template fabrication. The stripes of the patterns may be oriented along several different crystallographic directions, including [011] and [01$\bar{1}$], for example.

Figures 8A, 8B, 8C:
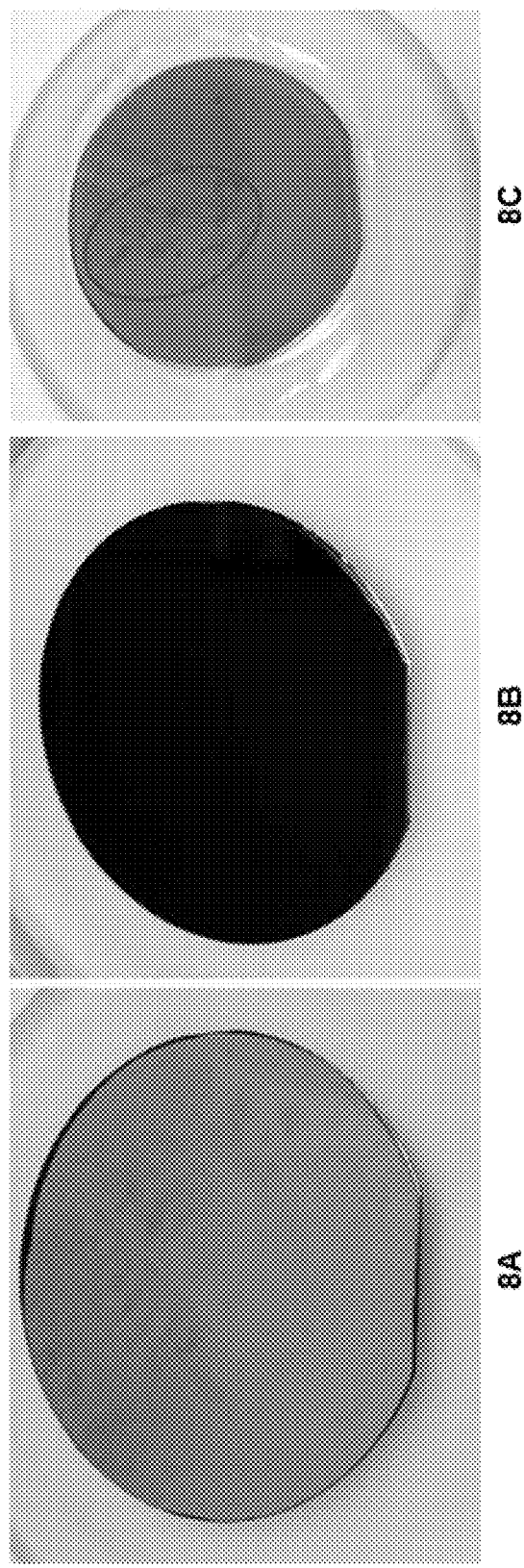
FIGS. 8A-8C show optical images of a full 2-inch GaAs fused pair after lapping the top wafer down to approximately 15 microns (8A) and polishing the top wafer down to approximately 5 microns (8B), and a GaP fused pair after polishing (8C)

The GaAs wafers 110, 115 may be fused together by an exemplary process as follows: Two GaAs (100) wafers are first cleaned with solvents (e.g., methanol, ethanol, acetone, etc.) After the cleaning procedure the wafers are assembled face against face with proper alignments in the way that ensures the opposite orientation of their crystallographic polarity. The wafer pair may then be placed between graphite shims and inserted into a graphite fixture. The graphite fixture is slid into a thick wall quartz tube, which is then introduced into a tube furnace with a controlled nitrogen purge flow. As the temperature of the graphite fixture is gradually raised to 700° C., the thermal expansion of the graphite fixture is suppressed by the quartz tube, thereby applying a compressive force to the wafer pair and fusing them together. Upon successful fusion, the top GaAs layer 115 of the fused pair is thinned down to within about 10 µm to about 15 µm of the bonding interface using mechanical lapping and polishing. This process is followed by further polishing the top surface of layer 115 until approximately 5 to about 10 µm of the top wafer remains with smooth surface morphology. Optical images of one of the GaAs fused pair after lapping and polishing are shown in FIGS. 8A and 8B, respectively.

At this point, photolithography may be used to transfer the grating pattern with the desired domain periods onto the top wafer. Accordingly, as shown in layered structure 310, an imaged photoresist layer 140 may be formed on the top surface of GaAs layer 115 by applying a photoresist material and then exposing the layer of photoresist to patterned light to form unimaged areas 143 and imaged areas 146. Following development of the imaged areas 146, the exposed areas of GaAs layer 115 may be removed using selective etching processes (e.g., inductively coupled plasma (ICP) dry etching) to etch into the bottom GaAs layer 110 to reveal the alternate crystallographic orientation. Further analysis of the template by scanning electron microscope (SEM) imaging of the top surface revealed some etch damage (FIG. 9A) while the cross-section showed no voids or defects at the interface (FIG. 9B).

The foregoing process for making the requisite OPGaAs template 20 is advantageously a molecular beam epitaxy (MBE) free process. Eliminating the need to use expensive MBE equipment can sharply reduce the cost of the GaAs template 20. The polishing process, however, must be precisely accomplished to leave behind a layer that is uniformly about 5 microns to about 10 microns thick. Polishing off too much could remove the entire top layer 115, while polishing too little would not expose the underlying inverted polarity layer 110. These problems can be compounded when the inverted layer left behind by polishing is not uniform.

Although not shown, one way to avoid non-uniformity in the GaAs wafer caused by anisotropic etching is to utilize an etch-stop. More specifically, a thin layer of an "etch-stop" material (e.g., AlGaAs) may be deposited by MBE onto one of the GaAs wafers, followed by deposition of a thin GaAs layer with a controlled thickness. After the two wafers are bonded and a rough polishing step has removed most of the upper layer, the operator can etch away all of the remaining GaAs above the etch-stop. This is done with a chemical that does not attack the etch-stop material. In the next step, the etch-stop layer itself can be chemo-selectively etched away by a chemical that does not etch GaAs. In this way, the thickness of the upper GaAs layer (and from here the presence of the two opposite orientations) can be very precisely controlled. The use of an etch-stop layer reveals another advantage of using OPGaAs templates instead using OPGaP templates as far as to this moment a suitable etch-stop material for GaP has not been discovered yet.

Another alternative MBE process (also not shown) for preparing the OPGaAs template 20 involves an MBE machine depositing an atomically thin layer of a non-polar material: a chemical element that can switch the polarity of the GaAs subsequently grown on it. For GaAs, one suitable non-polar material is Ge, whose ionic radius is close to that of arsenic. A thin layer of GaAs deposited on the Ge layer will have an inverted polarity with respect to the underlying GaAs substrate. At this point, standard photolithography and etching processes are used to expose the underling orientation for every other domain, resulting in a pattern of alternating domains of opposite polarity.

Figure 4:
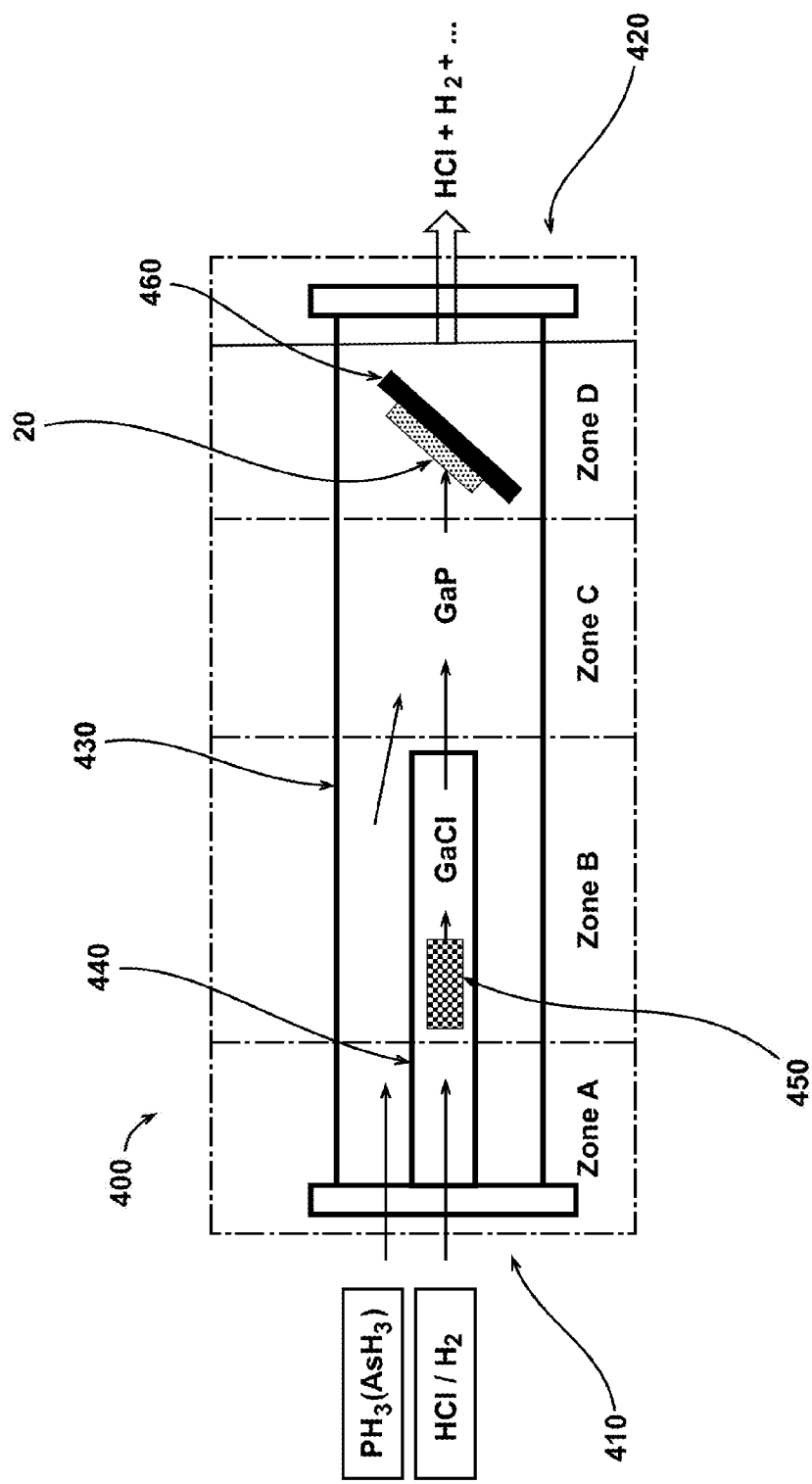
FIG. 4 is a schematic illustrating a Hydride Vapor Phase Epitaxy (HVPE) apparatus for performing HPVE growth of OPGaP on an OPGaAs template, in accordance with an embodiment of the present invention.

In accordance with another embodiment of the present invention, a method for forming the layered OP material 100 (or 200) is provided that comprises performing a heteroepitaxial growth of GaP on the GaAs template (20) in an HPVE reactor. In reference to FIG. 4, the OPGaAs template 20 is placed within an HVPE reactor 400, which may be a horizontal hot-wall quartz reactor adapted for low-pressure operation. The HVPE reactor 400 includes an inlet 410, an outlet 420, a vessel wall 430, an inner quartz tube 440, an elemental Ga sample 450 within the inner quartz tube 440, and a sample holder 460 for holding the OPGaAs template 20. The reactor 400 further includes related electronics for controlling various parameters such as gas flow rates, reactor pressure and temperatures.

The inlet 410 of the HPVE reactor 400 includes gas tanks, manual and/or automatic (e.g., pneumatic) valves, and mass flow controllers. The supply gasses are HX, hydrogen ($H_2$), phosphine, and arsine. Nitrogen may be used for purging. Typically, high purity gases are used. The INIT INSTRUMENTS mass flow controllers (MFCs) may be controlled by using Labview®-based software. The outlet 420 includes manual valves, a butterfly automatic valve driven by a pressure controller, filters, and a vacuum pump.

The object of the methods disclosed herein is to achieve an OP-structure, i.e., a linear array of alternating regions of inverted crystallographic polarity of GaP. In order to achieve suitable hetero-epitaxial growth of OPGaP on the OPGaAs template 20, with the desired domain period and fidelity at the 100 micron and the 200 micron OPGaP thicknesses, various operating parameters (gas flow rates, pressures, temperatures, V/III ratio, and supersaturation) were found to be favorable.

Flow rates: In accordance with embodiments of the presence invention, during operation total flow rates of reactant gases (e.g., HCl and phosphine) and carrier gas(es) (e.g., $H_2$) may be less than about 300 sccm. For example, the maximum gas flow through the reactor may be about 200 sccm, about 220 sccm, about 225 sccm, about 240 sccm, about 250 sccm, about 265 sccm, about 280 sccm, or in a range between any two of the foregoing, such as in a range from about 200 sccm to about 265 sccm, or about 200 sccm to about 240 sccm.

System pressure: In accordance with embodiments of the present invention, during operation system pressure is maintained in a range from about 2 Torr to about 50 Torr. For example, the system pressure may be about 2 Torr, about 3 Torr, about 4 Torr, about 5 Torr, about 6 Torr, about 7 Torr, about 8 Torr, about 9 Torr, about 10 Torr, about 15 Torr, about 20 Torr, about 25 Torr, about 30 Torr, about 50 Torr, or in a range between any two of the foregoing. In one example, the system pressure is maintained in a range from about 2 Torr to about 25 Torr, or about 2 Torr to about 15 Torr, or about 2 Torr to about 5 Torr.

Temperature: The HVPE reactor 400 is typically surrounded by a heater that includes distinct heating zones, which are independently controlled. With continued reference to FIG. 4, the surrounding heater can be configured to control the temperature in Zones A-D, such as an inlet temperature (Zone A); an elemental Ga sample temperature (Zone B), where the Ga boat is placed; a mixing zone temperature (Zone C), extending from the end of the inner quartz tube 440 to the sample holder 460; and a substrate temperature (Zone D). Operationally, the reactor 400 may also be divided into three technological zones: 1—formation of GaX; 2—mixing zone; and 3—growth zone.

In accordance with embodiments of the present invention, Zone D is controlled to provide a temperature at the sample holder 460, and thus the temperature of the OPGaAs template 20, in a range from about 715° C. to about 740° C. For example, the temperature of the OPGaAs template 20 during the GaP growth process may be about 715° C., about 720° C., about 725° C., 730° C., about 735° C., about 740° C., or within a range between any two of the foregoing.

V/III ratio: In accordance with embodiments of the present invention, the mass ratios of the reactant species flowing into the mixing zone (Zone C) is maintained to achieve an atomic ratio of phosphorus to gallium of about 6.0 to about 8.0. Accordingly, the atomic ratio of P:Ga may be about 6.0, about 6.1, about 6.2, about 6.3, about 6.4, about 6.5, about 6.6, about 6.7, about 6.8, about 6.9, about 7.0, about 7.1, about 7.2, about 7.3, about 7.4, about 7.5, about 7.6, about 7.7, about 7.8, about 7.9, about 8.0, or within a range between any two of the foregoing.

One conventional manner of expressing this P:Ga atomic ratio is to account for the expected chemical compounds present in the gas phase. For example, if HCl is reacted with molten Ga, then GaCl is the expected product, and the phosphine (V) to GaCl (III) mass ratio (V/III) would be about 2.0 to about 2.5. Conversely, if HBr is reacted with molten Ga, then GaBr is the expected product, and the phosphine to GaBr mass ratio (V/III) would be about 1.4 to about 1.8. The foregoing atomic ratio and/or V/III mass ratios are sufficient to provide the 1:1 atomic ratio for phosphorus-to-gallium (P:Ga) needed for forming GaP via the heteroepitaxial growth of the OPGaP layer 30 on the OPGaAs template 20.

The mass of phosphine (and therefore phosphorous) flowing into the mixing zone of the reactor 400 is readily controlled by a mass flow controller. However, the mass of gallium flowing into the mixing zone is dependent upon a variety of factors that influence the pickup ratio, i.e. what part of the HX flow forms and picks up GaX from the elemental melted Ga in the boat. The pickup ratio may be experimentally determined based on the operating conditions of the reactor 400. In one example, the pickup ratio of HCl was found to be about 0.62 (i.e., only 62% of the HCl picks up Ga).

Supersaturation: The relative supersaturation of the vapor phase γ can be defined as the state of the advancement of the growth reaction with respect to equilibrium. It can be written as the ratio of the partial pressures of gaseous molecules over the substrate to the equilibrium constant K(T):

$$\gamma = \frac{[GaCl][PH_3]^{1/3}[H_2]^{1/2}}{[HCl]K(T)}$$

In accordance with embodiments of the present invention, the supersaturation is about 0.5 to about 5.0, which is much lower in the case of HVPE, a close-to-equilibrium process, in comparison to the non-equilibrium MOCVD growth. For example, the supersaturation level may be about 0.5, about 0.6, about 0.7, about 0.8, about 0.9, about 1.0, about 1.5, about 2.0, about 2.5, about 3.0, about 3.5, about 4.0, about 4.5, about 5.0, or within a range between any two of the foregoing.

Figure 5:
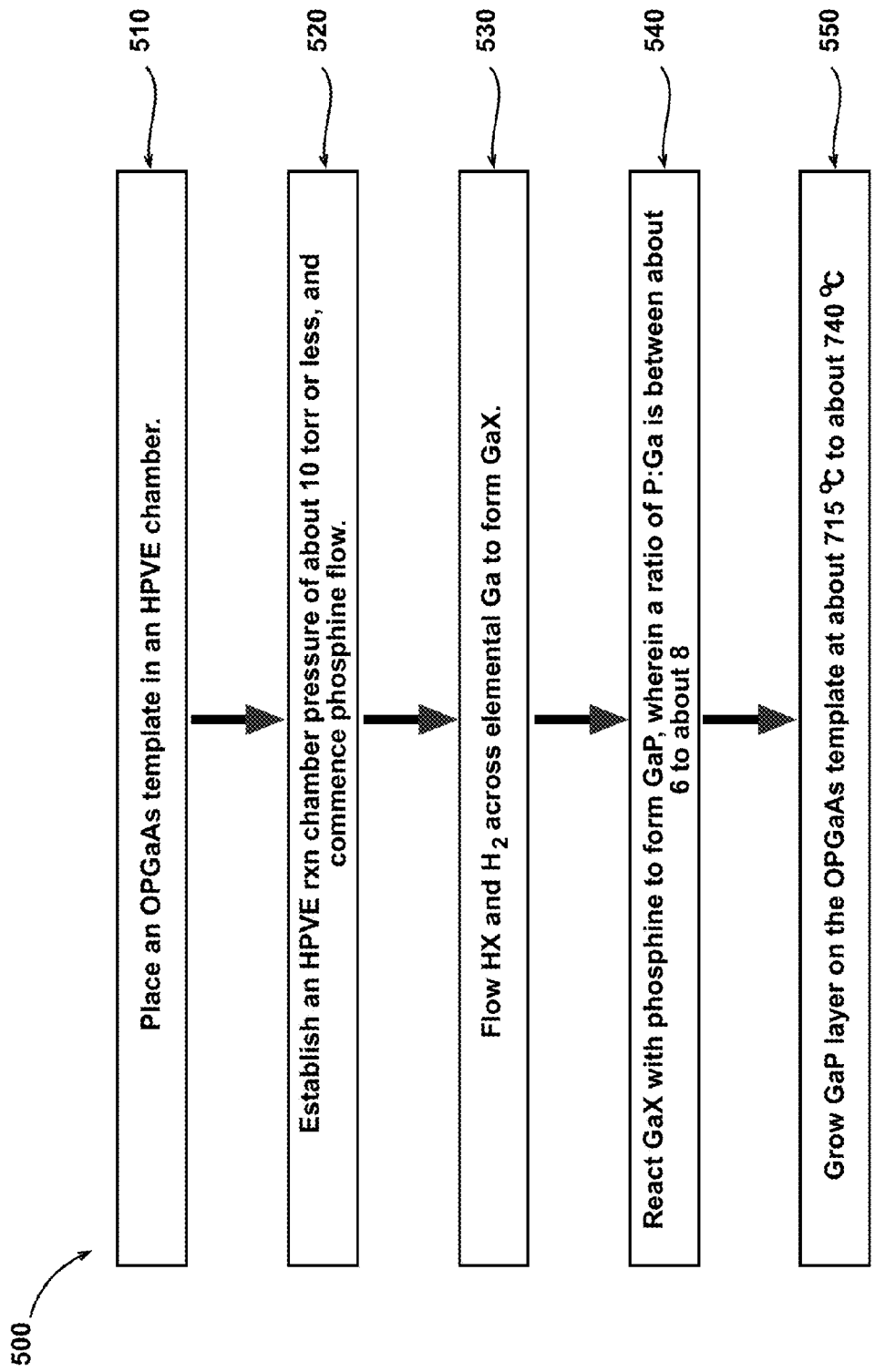
FIG. 5 illustrates a method for forming a layered OPGaP material using an HPV hetero-epitaxial approach, in accordance with an embodiment of the present invention.

In reference to FIG. 5, a method 500 for fabricating an OP material is provide that includes: Step 510—Place an OPGaAs template in an HPVE reaction chamber; Step 520—Establish an HPVE reaction chamber pressure of about 10 torr or less, and commence phosphine flow; Step 530—Flow HX and $H_2$ across elemental molten Ga to form GaX; Step 540—React GaX with phosphine to form GaP, wherein an atomic ratio of P:Ga is between about 6.0 to about 8.0; and Step 550—Grow an OPGaP layer on the OPGaAs template at about 715° C. to about 740° C.

Operationally, it should be appreciated that the reactor 400 may be purged prior to or during heat up. Also, in order to protect the OPGaAs template 20 from decomposition, phosphine and/or arsine (with or without a carrier gas) may be passed through the reactor 400, insofar as no GaX forms until HX (e.g., HCl) is introduced.

In accordance with another embodiment of the present invention, the method may also include forming the intermediate layer 120 (see FIG. 2). It should be appreciated that if only phosphine is used in a preconditioning step and during the growth step, then an unintentional intermediate GaAsP layer may also be formed.

According to some theoretical predictions, the thickness of this intermediate layer should be at least about 20 monolayers or approximately about 100 Å to about 120 Å, which is, actually, the thickness of the so-called pseudomorphous growth. After that, screw dislocations may start to appear again, but the good start of the growth should matter for the later stages of growth and from here for the layer crystalline quality. However, if an intermediate layer 120 is desired to assist in the transition from the GaAs lattice to the GaP lattice, then a mixture of arsine and phosphine are used during the growth phase. Accordingly, the intermediate layer 120 is intentional and its thickness will be dependent on several factors that include the V/III ratio, the ratio of phosphine to arsine, and the duration of exposure to the phosphine/arsine mixture.

Additionally, phosphine is approximately 2.42 times lighter than arsine (e.g., compare atomic weights), which means if a 1:1 composition of P and As are desired in the intermediate layer 120, i.e. x=0.5 in the general chemical formula $GaAs_xP_{1-x}$, then a phosphine/arsine mass flow ratio should be about 2.42 (e.g., about 2.4). Additionally, to maintain x within the range of 0<x<1, the phosphine/arsine mass flow ratio may be in a range from about 0.0242 to about 242 (e.g., about 0.2 to about 240).

Following the foregoing steps 510-550 shown in FIG. 5, which are performed in accordance with HPVE conditions described above, affords the desired OPGaP material having alternating regions of inverted crystallographic polarity of GaP that generally correspond to the first and second features of the patterned layer of GaAs; and continued exposure grows the layer of OPGaP to reach a thickness of about 100 micron thickness or more, for example about 200 microns or more.

Examples

The HPVE furnace is a Four Zone Thermocraft™ (Thermocraft Incorporated, Winston Salem, N.C.), which is 48 inches long. The temperatures of the four zones (Zones A-D) are controlled by 4 independent EUROTHERM controllers. Excluding the 3 inch insulation portions at both ends, the heating zone lengths are 12 in, 6 in, 12 in, and 12 in. As described above, the furnace may be divided in tree technological zones: Zone 1, where the Ga-boat is placed: Zone 2, the mixing zone, which starts from the end of the nozzle and continues to the substrate; Zone 3, which is the growth zone. The temperature in all 4 zones may be set differently. The Ga-boat may be maintained at about 1,000° C. The mixing zone generally has a slightly higher temperature (e.g., about 10° C. to about 20° C. higher, or about 15° C. to about 20° C. higher) than the growth zone (i.e., substrate temperature). In this Thermocraft™ Four-Zone Furnace, the substrate temperature is correlated to the temperature of physical zone 3, which in one example is set to 742° C. and thus provides a substrate temperature of about 725° C. inside. The quartz tube used in the furnace is 60 inches long and has a diameter of about 3 inches. The pressure is controlled using an automatic butterfly valve controlled by a MKS 600 Series pressure controller, and the vacuum pump is a dry pump ESR 20N.

Growth Results and Discussion

In one example, the growth experiments were performed on plain (100) GaAs substrates using HCl, a V/III ratio of 2.25, supersaturation between 0.5 and 5.0, and substrate temperatures of 725-735° C. During all the growth runs the GaAs wafers were exposed to phosphine ($PH_3$) at 300° C.-350° C., which is well below GaAs decomposition temperature, to mitigate arsenic (As) desorption from the GaAs surface. Distinct 3D hillocks-like features were observed on the surfaces of plain "on-axis" (100) GaAs substrates, while the growth on (100) GaAs substrates with 2-4° miscuts towards orientations (011) or (111)B had typically smoother surface morphology. Both, the hillock formation and the smooth surface morphology achieved are consistent with earlier findings of HVPE growth of GaP.

Wafer fusion of full 2-inch templates using plain (100) GaAs wafers without the deposition of a MBE-grown etch-stop layer was demonstrated (1) to overcome commercially available GaP material quality issues, and (2) to make the template fabrication process more cost-effective. The subsequent HVPE thick growth of GaP on these OPGaAs templates as well on the OPGaAs templates prepared by the MBE-assisted approach resulted in ~300 µm thick growth of OPGaP with mixed domain fidelity. The quality of the latter was higher, due to the fact that the wafer bonding technique for GaP is an earlier stage.

Figure 6A:
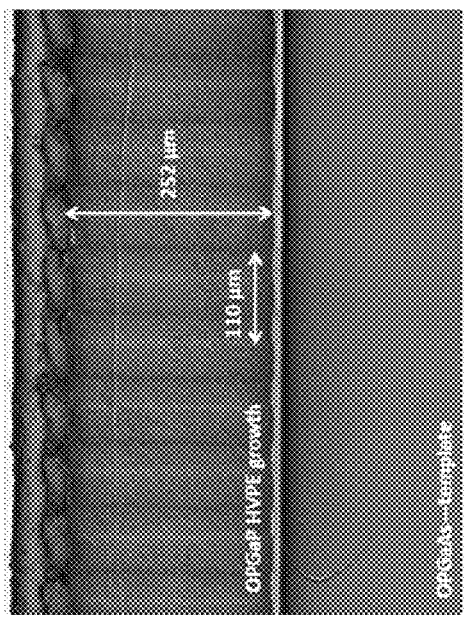
FIGS. 6A and 6B are magnified photographs of cross-sections of layered OPGaP grown on an OPGaAs templates, in accordance with an embodiment of the present invention.
Figure 6B:
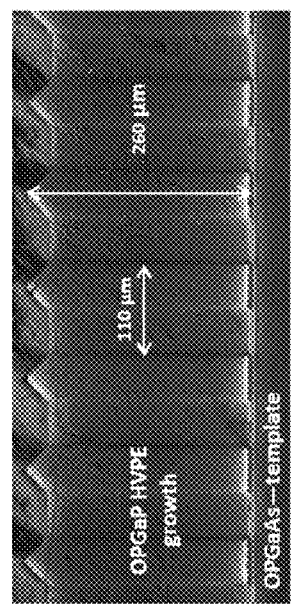

FIG. 6 is a magnified photograph of a cross-section of a layered OPGaP on an OPGaAs template, in accordance with an embodiment of the present invention. The HVPE-grown OPGaP layer is grown for 4 hours. One can clearly see that the shape of the top surfaces of the two oppositely oriented domains is different. One of them has a flat top surface terminated only by one lower index crystallographic facets, while the opposite crystallographic domain is terminated by two higher index facets (111) which, growing in competition, are building the volume of this domain. There are certain ways to find out the absolute orientation of each domain.

Figure 7:
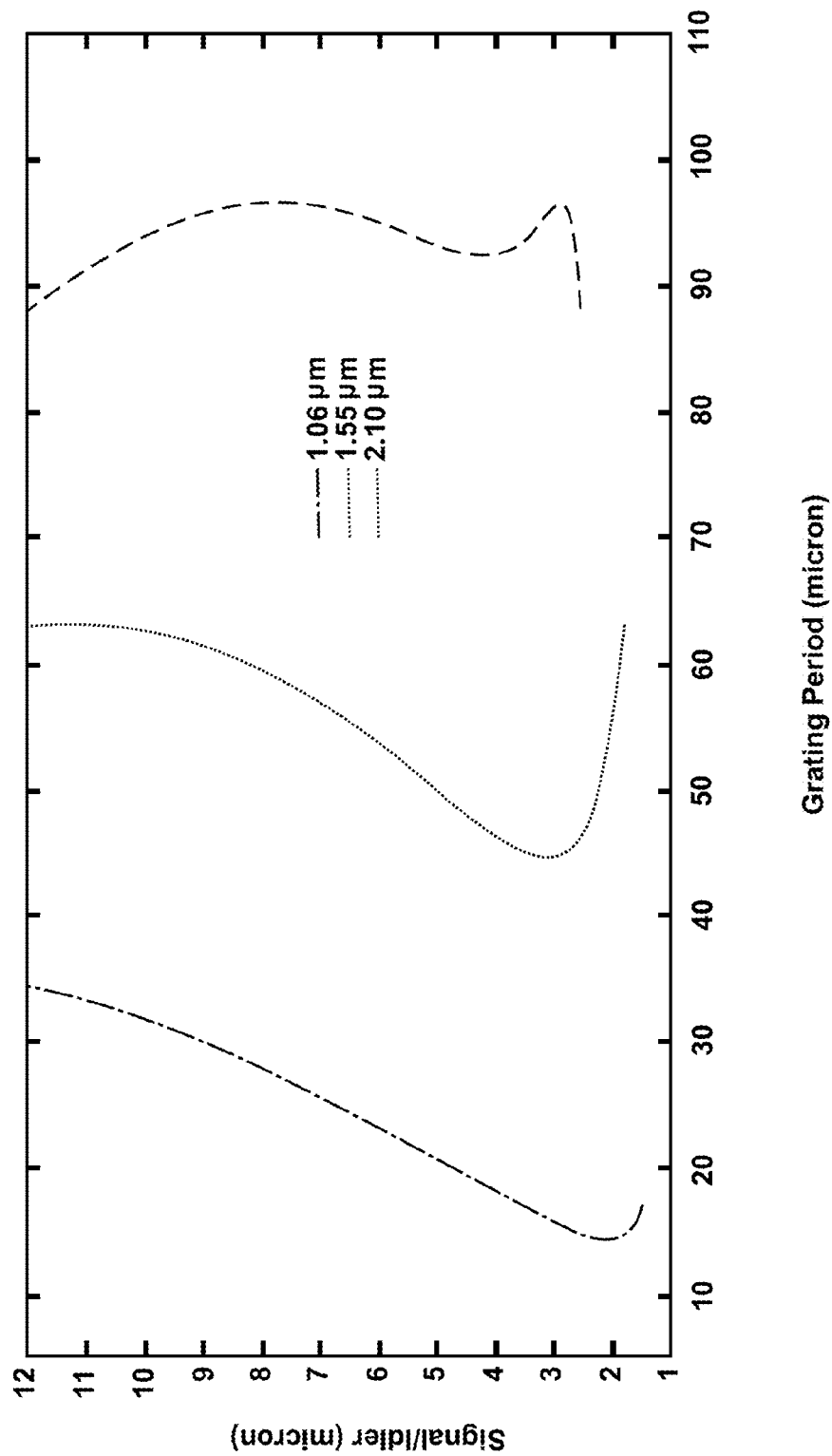
FIG. 7 shows calculated output wavelengths for an OPGaP optical parametric oscillator (OPO) as a function of QPM period, for three different pump wavelengths.

FIG. 7 shows calculated output wavelengths for an OPGaP optical parametric oscillator (OPO) as a function of QPM period, for three different pump wavelengths, including the 1.06 µm wavelength available from mature, commercial Nd- and Yb-based sources, the 1.55 µm wavelength popular for telecommunications devices, and a 2.10 µm wavelength source.

FIGS. 8A-8C show optical images of a full 2-inch GaAs fused wafer pair after lapping the top wafer down to approximately 15 microns (8A) and then polishing the top wafer down to approximately 5 microns (8B). In contrast with the bonding of GaP wafers (8C), no voids are seen when bonding GaAs wafers due to their better parallelism and surface quality.

FIGS. 9A and 9B show scanning electron microscope (SEM) images of an OPGaAs template from a top view showing alternate domains with some etch damage in the etched region (9A)—one can noticed that the etching pattern is slightly different for the two opposite orientations; and a cross-sectional image showing no discernible interface (9B).

FIG. 10 shows optical (A and B) and SEM (C) images of a cross-section of a OPGaP/GaAs hetero-structure obtained after 1 hour of growth.

Figure 11A:
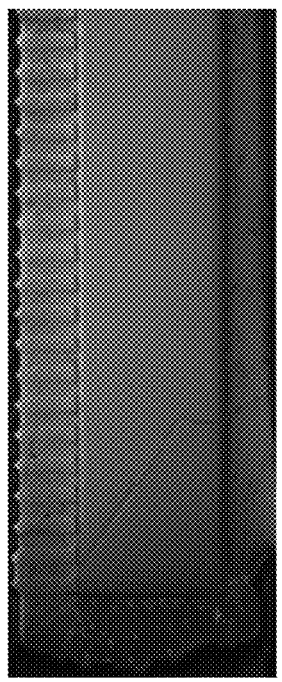
FIGS. 11A-11C shows optical microscope images of cross-sections of a single OPGaP/GaAs hetero-structure showing good period fidelity across the entire wafer.
Figure 11B:
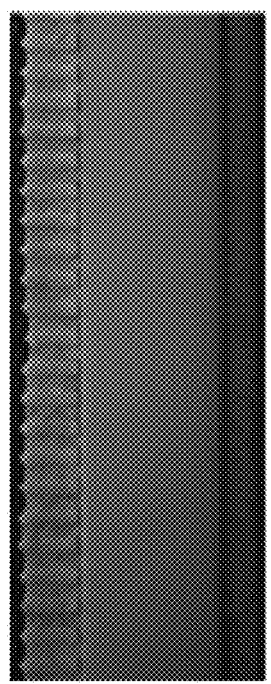
Figure 11C:
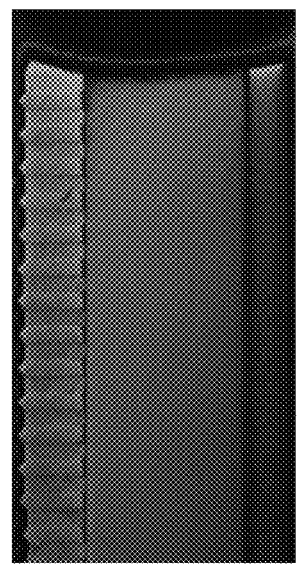

FIGS. 11A-11C show optical microscope images of cross-sections of a single OPGaP/OPGaAs hetero-structure exhibiting QPM period fidelity across the entire wafer.

While the present invention has been illustrated by the description of one or more embodiments thereof, and while the embodiments have been described in considerable detail, they are not intended to restrict or in any way limit the scope of the appended claim to such detail. Additional advantages and modification will be readily apparent to those skilled in the art. The invention in its broader aspects is therefore not limited to the specific details, representative apparatus and methods and illustrative examples shown and described. Accordingly, departures may be made from such details without departing from the scope or the spirit of the general inventive concept exemplified herein.

What is claimed is:

1. A method for forming a layered orientation patterned material comprising:
   placing an orientation patterned gallium arsenide template comprising a patterned layer of gallium arsenide into a hydride vapor phase epitaxy (HVPE) reaction chamber comprising an elemental gallium sample, wherein the patterned layer of gallium arsenide has alternating features of inverted crystallographic polarity, the patterned layer comprising:
      a first feature comprising a first crystallographic polarity form of gallium arsenide having a first dimension, and a second feature comprising a second crystallographic polarity form of gallium arsenide having a second dimension, wherein a sum of the first and second dimensions defines a period of the patterned layer of gallium arsenide;
   establishing an HVPE reactor chamber pressure of about 10 Torr or less;
   flowing a gaseous mixture of a hydrogen halide and hydrogen across the elemental gallium sample to form gallium halide;
   reacting gallium halide with an excess of phosphine to form gallium phosphide, wherein an atomic ratio of phosphorus to gallium is between about 6.0 to about 8.0;
   growing a layer of gallium phosphide on the orientation patterned gallium arsenide template at a temperature in a range of about 715° C. to about 740° C., wherein the layer of gallium phosphide comprises alternating regions of inverted crystallographic polarity of gallium phosphide that generally correspond to the first and second features of the patterned layer of gallium arsenide; and
   continuing to grow the layer of gallium phosphide to reach a thickness of about 100 micron or more.

2. The method of claim 1, wherein the hydrogen halide is hydrogen chloride, and wherein the gallium halide is gallium chloride.

3. The method of claim 1, wherein reacting gallium halide with an excess of phosphine to form gallium phosphide further comprises,
   introducing arsine with phosphine to react a portion of the gallium halide with the arsine to form gallium arsenide.

4. The method of claim 3, wherein a mass flow ratio of phosphine to arsine is in a range from about 0.2 to about 240.

5. The method of claim 3, wherein a mass flow ratio of phosphine to arsine is about 2.4.

6. The method of claim 3, wherein introducing arsine with the phosphine is conducted for a duration sufficient to form a layer of a ternary mixture of gallium, arsenic, and phosphorous at a thickness of about 10 nm or more, wherein the ternary mixture is represented by a general chemical formula $GaAs_xP_{1-x}$, where x is in a range from $0 < x < 1$.

7. The method of claim 1, wherein the period of the patterned layer of gallium arsenide is at least 30 microns with at least each of the first and second dimensions having a minimum width of about 15 microns.

8. The method of claim 1, wherein each of the alternating regions of inverted crystallographic polarity of gallium phosphide has a width that generally corresponds to its respective first and second dimensions at the 100 micron thickness.

9. The method of claim 1, wherein the first and second dimensions have approximately equal width.

10. The method of claim 1, wherein the patterned layer of gallium arsenide includes a plurality of first and second features; and wherein the periods of the first and second features are approximately constant across the orientation patterned gallium arsenide template.

\* \* \* \* \*